(12) United States Patent
Liu et al.

(10) Patent No.: US 12,149,041 B2
(45) Date of Patent: Nov. 19, 2024

(54) TERAHERTZ RADIATOR BASED ON COHERENT SPR AMPLIFIED BY STIMULATION

(71) Applicant: Tsinghua University, Beijing (CN)

(72) Inventors: Fang Liu, Beijing (CN); Yuechai Lin, Beijing (CN); Jinyu Li, Beijing (CN); Yidong Huang, Beijing (CN); Kaiyu Cui, Beijing (CN); Xue Feng, Beijing (CN); Wei Zhang, Beijing (CN)

(73) Assignee: Tsinghua University, Beijing (CN)

( * ) Notice: Subject to any disclaimer, the term of this patent is extended or adjusted under 35 U.S.C. 154(b) by 730 days.

(21) Appl. No.: 17/304,582

(22) Filed: Jun. 23, 2021

(65) Prior Publication Data

US 2021/0408754 A1 Dec. 30, 2021

(30) Foreign Application Priority Data

Jun. 24, 2020 (CN) .......................... 202010591435.3

(51) Int. Cl.
*H01S 3/0959* (2006.01)
*G01N 21/3581* (2014.01)
*H01S 5/12* (2021.01)

(52) U.S. Cl.
CPC ....... *H01S 3/0959* (2013.01); *G01N 21/3581* (2013.01); *H01S 5/1234* (2013.01)

(58) Field of Classification Search
CPC .. H01S 3/0959; H01S 5/1234; H01S 2302/02; H01S 1/005; G01N 21/3581
See application file for complete search history.

(56) References Cited

U.S. PATENT DOCUMENTS

2014/0301414 A1* 10/2014 Gardelle ............... H01S 3/0903
  372/2
2018/0287329 A1* 10/2018 Yang ...................... H01J 7/44

FOREIGN PATENT DOCUMENTS

CN   103779763 A   5/2014
CN   104466617 A   3/2015
(Continued)

OTHER PUBLICATIONS

Chinese Office Action issued for Chinese Patent Application No. 202010591435.3 dated Apr. 2, 2021 in 11 pages Including English translation.
(Continued)

*Primary Examiner* — Yuanda Zhang
(74) *Attorney, Agent, or Firm* — Knobbe, Martens, Olson & Bear, LLP

(57) ABSTRACT

A terahertz radiator is based on coherent Smith-Purcell radiation amplified by stimulation. The terahertz radiator includes an electron emission source configured to emit electron beams and a pumping source configured to emit pumping signals. The pumping signal interacts with a primary grating structure to obtain preliminarily bunched electrons. The preliminarily bunched electrons interact with the primary grating structure to generate coherent Smith-Purcell radiation. The coherent Smith-Purcell radiation and the pumping signals vertically resonate in a primary resonant cavity structure, so that the electron bunching density is increased, and in turn, the coherent Smith-Purcell radiation is enhanced. A positive feedback process is formed by free electrons and the coherent Smith-Purcell radiation, and the coherent Smith-Purcell radiation amplified by stimulation and periodic bunched electron bunches are obtained. The terahertz radiator can be used to realize a stimulated ampli-
(Continued)

fication phenomenon under the conditions of small current and large beam spots.

10 Claims, 3 Drawing Sheets

(56) References Cited

FOREIGN PATENT DOCUMENTS

| CN | 105742141 A | * | 7/2016 | ............. H01J 25/02 |
|----|-------------|---|--------|--------------------------|
| CN | 105938972 A |   | 9/2016 |                          |
| CN | 108471039 A |   | 8/2018 |                          |
| CN | 110444996 A |   | 11/2019 |                         |
| CN | 110491752 A |   | 11/2019 |                         |

OTHER PUBLICATIONS

Search Report issued for Chinese Patent Application No. 202010591435.3 dated Mar. 25, 2021 in 3 pages.

* cited by examiner

TERAHERTZ RADIATOR BASED ON COHERENT SPR AMPLIFIED BY STIMULATION

CROSS-REFERENCE TO RELATED APPLICATION

The present application claims priority to Chinese patent application No. 202010591435.3 filed on Jun. 24, 2020, entitled "Terahertz Radiator Based on Coherent SPR Amplified by Stimulation", the disclosure of which is hereby incorporated by reference in its entirety.

FIELD OF TECHNOLOGY

The present application relates to the field of terahertz radiation sources, and in particular to a terahertz radiator based on coherent Smith-Purcell radiation amplified by stimulation.

BACKGROUND

After in-depth research, it is found that a traditional THz (Terahertz) radiation source based on vacuum electronic devices is very difficult to provide high-frequency THz radiation (greater than 0.3 THz). In particular, electron guns need to meet extremely high requirements to provide stimulated Smith-Purcell radiation. The beam of the electron gun needs to meet the following two conditions: firstly, the beam spot diameter of the electron gun needs to be small enough to ensure that an action distance between the electron beam and a slow-wave structure is close enough to generate a radiation field; secondly, the current intensity of the electron beam needs to be large enough to meet the gain condition of stimulated emission of electrons.

When the frequency of the stimulated radiation increases to 0.3 THz frequency band, in order to make the electron beam and the device structure fully interact, the electron beam spot needs to be reduced to the order of 10 μm, which generally requires a strong magnetic field for focusing. However, the size of the electron beam spot is reduced and the Coulomb repulsion between electrons is enhanced. At this time, it is difficult to ensure that the current intensity is greater than the current threshold of stimulated radiation. Taking the backward-wave tube in vacuum electronic devices as an example, the backward-wave tube generates a backward wave mode through the interaction between free electrons and a grating, and uses the backward wave mode on the grating surface to modulate the electrons to achieve bunching, and then the radiation intensity is increased by the bunching of electrons to achieve stimulated radiation. However, the conditions such as the focusing of the electron beam, the current intensity, and the action distance between the electron beam and the grating have been severe. As a result, with the increase of frequency (greater than 0.3 THz), it is difficult to achieve the scheme of using back-wave modulated electrons for stimulated amplification between the electron beam and the grating, that is, it is impossible to realize the stimulated amplification phenomenon under the conditions of small current and large beam spots.

BRIEF SUMMARY

In order to solve at least the problems in the prior art, an embodiment of the present application provides a terahertz radiator based on coherent Smith-Purcell radiation amplified by stimulation.

Specifically, an embodiment of the present application provides the following solutions.

An embodiment of the present application provides a terahertz radiator based on coherent Smith-Purcell radiation amplified by stimulation, including:

an electron emission source, a pumping source, a primary resonant cavity structure, and a primary grating structure; wherein the primary grating structure is located inside the primary resonant cavity structure;

the electron emission source is located at an axial inlet position of the primary resonant cavity structure, and is configured to emit electron beams which are incident into the primary resonant cavity structure along an axial direction of the primary resonant cavity structure and then fly along a surface of the primary grating structure;

the pumping source is located at an inlet position on a side wall of the primary resonant cavity structure, and is configured to emit pumping signals which are incident into the primary resonant cavity structure and then interact with the primary grating structure on the surface of the primary grating structure to generate a periodic electromagnetic field; the periodic electromagnetic field causes electrons flying along the surface of the primary grating structure to preliminarily bunch to obtain preliminarily bunched electrons; wherein the frequency of the pumping source is in a vertical resonance mode of the primary resonant cavity structure;

the preliminarily bunched electrons interact with the primary grating structure to generate coherent Smith-Purcell radiation;

the coherent Smith-Purcell radiation and the pumping signals vertically resonate in the primary resonant cavity structure, and together modulate the electron energy in the primary resonant cavity structure, causing an increase in electron bunching density, thereby enhancing the coherent Smith-Purcell radiation;

in the primary resonant cavity structure, a positive feedback process is formed by an energy interaction between free electrons and coherent Smith-Purcell radiation to obtain coherent Smith-Purcell radiation amplified by stimulation and periodic bunched electron bunches.

In an embodiment, the terahertz radiator further includes: a secondary resonant cavity structure and a secondary grating structure; an electron beam input end of the secondary resonant cavity structure is connected to an electron beam output end of the primary resonant cavity structure; the secondary grating structure is located inside the secondary resonant cavity structure, and the period of the secondary grating structure is smaller than the period of the primary grating structure;

after entering the secondary resonant cavity structure, the periodic bunched electron bunches output from the primary resonant cavity structure interact with the secondary grating structure on the surface of the secondary grating structure to generate a high-order frequency multiplication coherent Smith-Purcell radiation with a preset frequency multiplication order;

wherein, the frequency multiplication order is a frequency multiplication order of the high-order frequency multiplication coherent Smith-Purcell radiation relative to the pumping source.

In an embodiment, an electron bunching includes three states: preliminary bunching, optimal bunching and over-bunching; correspondingly, the secondary resonant cavity structure and the secondary grating structure are disposed at positions where the electrons are in the optimal bunching state.

In an embodiment, the period of the secondary grating structure and the frequency multiplication order satisfy a first relationship model which is expressed as:

$$\frac{L_2}{m}\left(\frac{c}{v} - \cos\theta\right) = \frac{c}{nf_p};$$

wherein, $L_2$ represents the period of the secondary grating structure, m represents the order of the Smith-Purcell radiation, c represents the speed of light in vacuum, v represents the velocity of electrons, θ represents the radiation angle, n represents the frequency multiplication order, n is a positive integer greater than or equal to 1, and $f_p$ represents the pumping frequency of the pumping source.

In an embodiment, the pumping source outputs a first terahertz signal, the secondary resonant cavity structure outputs a second terahertz signal, and the frequency of the second terahertz signal is higher than the frequency of the first terahertz signal.

In an embodiment, the pumping source outputs a microwave signal, and the secondary resonant cavity structure outputs a terahertz signal.

In an embodiment, the electron velocity v, the period $L_1$ of the primary grating structure, and the pumping frequency $f_p$ of the pumping source satisfy a second relationship model which is expressed as: $f_p = v/L_1$.

In an embodiment, the electron beam has an energy of 10 to 30 keV, a current of 10 to 50 mA, and a beam spot diameter of 100 to 120 μm.

In an embodiment, the terahertz radiator further includes a magnetic ring structure;

the magnetic ring structure is wrapped outside the resonant cavity structure for focusing the electron beams.

In an embodiment, the terahertz radiator further includes an electron collector;

the electron collector is configured to collect the electron beam which is emitted by the electron emission source and passes through the grating structure and the resonant cavity structure.

According to the above-mentioned technical solutions that, for the terahertz radiator based on coherent Smith-Purcell radiation amplified by stimulation provided by the embodiments of the present application, the pumping signal generated by the pumping source interacts with the primary grating structure in the primary resonant cavity structure to generate a periodic electromagnetic field, and the electron beams emitted by the electron emission source are modulated by the periodic electromagnetic field to achieve preliminary bunching and obtain preliminarily bunched electrons. The preliminarily bunched electrons interact with the primary grating structure to generate coherent Smith-Purcell radiation, which may enhance the intensity and coherence of radiation. The coherent Smith-Purcell radiation and the pumping signals vertically resonate in the primary resonant cavity structure, and together modulate the electron energy in the primary resonant cavity structure, so that the electron bunching density is increased, and the coherent Smith-Purcell radiation is enhanced, which may further enhance the intensity and coherence of the radiation. In the primary resonant cavity structure, the energy interaction between free electrons and coherent Smith-Purcell radiation forms a positive feedback process to obtain coherent Smith-Purcell radiation amplified by stimulation and periodic bunched electron bunches, thus the terahertz radiator based on coherent Smith-Purcell radiation amplified by stimulation provided by the embodiment of the present application first allows free electrons to be preliminarily bunched through the external pumping source signal, and the interaction of the preliminarily bunched electrons and the grating generates coherent Smith-Purcell radiation, and at the same time, the coherent Smith-Purcell radiation signal is stimulated and amplified by the resonant cavity structure to obtain high-density periodic bunched electron bunches. It should be noted that the difference between the technical solutions in the embodiments of the present application and the stimulated radiation by backward wave oscillator lies in that the coherent Smith-Purcell radiation amplified by stimulation is achieved by means of the pumping signals and the resonant cavity structure, so that the requirements for the electron emission source may be lowered, as a result, high-intensity radiation may be achieved even under the conditions of small current and large beam spots.

BRIEF DESCRIPTION OF THE DRAWINGS

In order to more clearly illustrate technical solutions disclosed in the embodiments of the present application or the prior art, the drawings needed in the descriptions of the embodiments or the prior art will be briefly described below. Obviously, the drawings in the following description only show certain embodiments of the present application, and other drawings can be obtained according to the drawings without any creative work for those skilled in the art.

Figure 1:
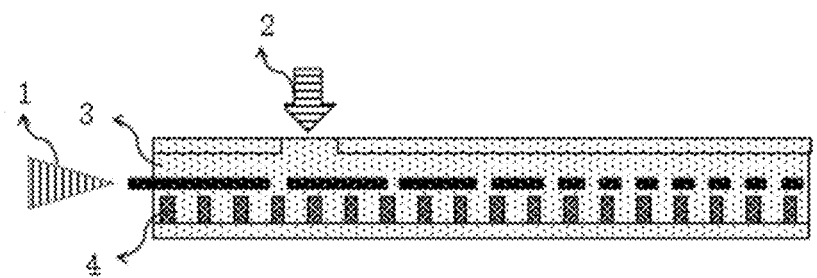
FIG. 1 is a schematic structural diagram of a terahertz radiator based on coherent Smith-Purcell radiation amplified by stimulation according to an embodiment of the present application.

| Reference Numerals: | |
| --- | --- |
| 1 | electron emission source |
| 2 | pumping source |
| 3 | primary resonant cavity structure |
| 4 | primary grating structure |
| 5 | secondary resonant cavity structure |
| 6 | secondary grating structure |
| 7 | high-order frequency multiplication coherent Smith-Purcell radiation signal |
| 8 | magnetic ring structure |
| 9 | electron collector |

DETAILED DESCRIPTION

In order to illustrate the objectives, technical solutions and advantages of the embodiments of present application clearly, the technical solutions in the embodiments of the present application will be described clearly in conjunction with the accompanying drawings in the embodiments of the present application. Obviously, the described embodiments are part of the embodiments of the present application, rather than all of the embodiments. All other embodiments obtained by a person of ordinary skill in the art based on the embodiments of the present application without any creative effort fall within the protection scope of the present application.

FIG. 1 is a schematic structural diagram of a terahertz radiator based on coherent Smith-Purcell radiation amplified by stimulation according to an embodiment of the present application. As shown in FIG. 1, the terahertz radiator based on coherent Smith-Purcell radiation amplified by stimulation includes:

an electron emission source 1, a pumping source 2, a primary resonant cavity structure 3, and a primary grating structure 4; wherein the primary grating structure 4 is located inside the primary resonant cavity structure 3;

the electron emission source 1 is located at an axial inlet position of the primary resonant cavity structure 3, and is configured to emit an electron beam which is incident into the primary resonant cavity structure along an axial direction of the primary resonant cavity structure 3 and then flies along a surface of the primary grating structure 4;

the pumping source 2 is located at an inlet position on a side wall of the primary resonant cavity structure 3, and is configured to emit pumping signals which are incident into the primary resonant cavity structure 3 and then interact with the primary grating structure 4 on the surface of the primary grating structure 4 to generate a periodic electromagnetic field; the periodic electromagnetic field causes electrons flying along the surface of the primary grating structure 4 to preliminarily bunch to obtain preliminarily bunched electrons; wherein the frequency of the pumping source 2 is in a vertical resonance mode of the primary resonant cavity structure 3;

the preliminarily bunched electrons interact with the primary grating structure 4 to generate coherent Smith-Purcell radiation;

the coherent Smith-Purcell radiation and the pumping signals vertically resonate in the primary resonant cavity structure 3, and together modulate the electron energy in the primary resonant cavity structure 3, causing an increase in the electron bunching density, thereby enhancing the coherent Smith-Purcell radiation;

in the primary resonant cavity structure 3, a positive feedback process is formed by an energy interaction between free electrons and the coherent Smith-Purcell radiation to obtain coherent Smith-Purcell radiation amplified by stimulation and periodic bunched electron bunches.

The working principle and specific working process of the terahertz radiator provided in this embodiment will be described below. The research purpose of the embodiment of the present application is to lower the requirements for electron beam when electrons are stimulated by radiation, and to realize the stimulation and coherent radiation of free electrons even under the conditions of small current and large beam spots. This embodiment mainly includes two parts: the first part is to preliminarily bunch DC electron beams using external pumping signals; the second part is to realize the coherent SPR amplified by stimulation in the vertical resonant cavity through the preliminary bunching of electrons. In addition, it should be noted that in other embodiments of the present application, a third part is also included, that is: using periodically bunched electron bunches generated during the stimulated amplification process to achieve high-order frequency multiplication THz radiation.

In this embodiment, the detailed description is mainly focused on the first part and the second part as mentioned above. The third part will be described in subsequent embodiments.

Figure 5:
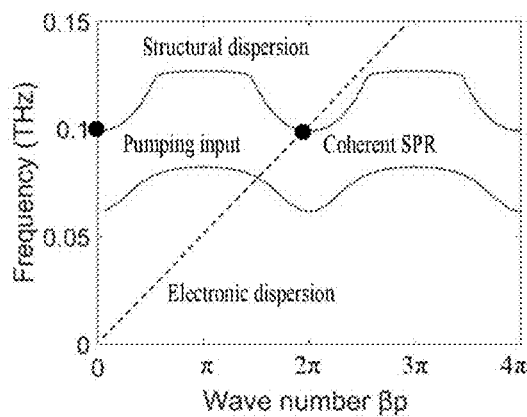
FIG. 5 is a schematic diagram showing dispersion curves formed by a primary resonant cavity structure and a primary grating structure according to an embodiment of the present application.

Regarding the first part of preliminarily bunching DC electron beams using pumping signals, the explanation is as follows: the DC electrons are preliminarily bunched through the pumping signals. The structures involved in the first part include a primary resonant cavity structure and a primary grating structure, and the frequency of the pumping source works at a point where the group velocity of the primary resonant cavity and the primary grating structure is zero. Taking a 0.1 THz pumping source as an example, the dispersion curves formed by the primary resonant cavity and the primary grating structure therein are shown in FIG. 5. By providing the primary grating and the primary resonant cavity structure, the pumping signal excites the vertical resonance mode in the structure, the corresponding group velocity being zero and the phase velocity tending to infinity. The pumping signal has functions of being incident into the primary resonant cavity and interacting with the primary grating to generate a periodic local field, allowing the DC electrons to be preliminarily bunched. At this time, the electron velocity v, the grating period $L_1$ and the pumping frequency $f_p$ satisfy the relationship $f_p = v/L_1$, that is, every time the electron passes through a grating period, the pumping signal oscillates at exactly one frequency. For example, the power of the pumping signal may be applied in the order of 1 mW~1 W, the energy of the electron beam is 10~30 keV, the beam spot diameter is 100~120 μm, and the electron beam current can be 10 mA~50 mA. so that the electrons will be preliminarily bunched under the action of the pumping.

Regarding the content of the second part of realizing the coherent SPR amplified by stimulation in the vertical resonant cavity through the preliminary bunching of electrons, the explanation is as follows: the coherent SPR amplified by stimulation is realized by the preliminary bunching of electrons in the primary resonant cavity. The coherent SPR of free electrons refers to electromagnetic radiation produced by the interaction of bunched electrons and gratings. In this embodiment, a stimulated coherent SPR device based on a resonant cavity is proposed, so that the preliminarily bunched electrons interact with the coherent SPR mode of the resonant cavity to generate a coherent SPR amplified by stimulation signal. The preliminarily bunched electrons interact with the primary grating in the primary resonant cavity, and their dispersion intersection point is also at the point where the group velocity is zero, as shown in FIG. 5, that is, the coherent SPR generated by the preliminarily bunched electrons also excites the vertical resonance mode in the cavity. This means that in the primary resonant cavity, in addition to the signal incident from the pumping source, there are also coherent SPR signals that resonate vertically in the cavity. As a result, the pumping signal and the coherent SPR signal of the preliminarily bunched electrons will further modulate the electron energy together, so that the electron bunching density is further increased, and the coherent SPR signal in the cavity will be further enhanced, and a positive feedback process of energy interaction between free electrons and coherent SPR signals is formed, namely, the coherent SPR amplified by stimulation is generated.

Figure 6:
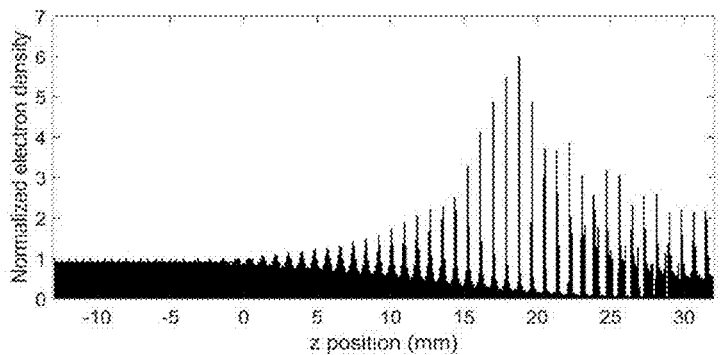
FIG. 6 is a schematic diagram showing a change in electron beam density according to an embodiment of the present application.

In this embodiment, taking the electron energy of the electron emission source as 22 keV as an example, the pumping signal is still 0.1 THz, and to illustrate the working process of the device, the power of pumping signal is set to 100 mW. FIG. 6 shows the change in electron beam density during the flight of electrons. By analyzing, it can be seen from FIG. 6 that the DC electrons will be preliminarily bunched under the action of the pumping signal. As the electrons fly, the pumping signal and the coherent SPR signal modulate the electron energy together, so that the bunching density gradually increases.

In this embodiment, the electron emission source 1 is located at the axial inlet of the primary resonant cavity structure 3, as shown in FIG. 1. The electron emission source 1 is configured to emit an electron beam, such as DC electrons, for example, with an energy of 10 to 30 keV, an electron beam current of 10 to 50 mA, and a beam spot diameter of 100 to 120 μm.

In this embodiment, the pumping source 2 is located at the inlet on the side wall of the primary resonant cavity structure 3, as shown in FIG. 1. The pumping source 2 is configured to transmit pumping signals, and the pumping signals are incident into the primary resonant cavity structure 3 and interact with the primary grating structure 4 to generate a periodic electromagnetic field through which the DC electrons are preliminarily bunched. It can be seen that in the embodiment of the present application, free electrons may be preliminarily bunched with the aid of the pumping signals emitted by the pumping source 2.

In this embodiment, the frequency of the pumping source 2 is in the vertical resonance mode of the primary resonant cavity structure 3, and is used for preliminarily bunching DC electrons.

In this embodiment, the preliminarily bunched electrons interact with the primary grating structure 4 to generate coherent Smith-Purcell radiation.

In this embodiment, it will first be explained what Smith-Purcell radiation (SPR) is. SPR refers to the electromagnetic radiation generated by the interaction between flying free electrons and a grating, and the coherent Smith-Purcell radiation is generated by the interaction between the preliminarily bunched electrons and a grating structure. Electromagnetic wave radiation will be stimulated when the electron beam flies close to the surface of the metal grating, this effect is called the Smith-Purcell radiation effect, and the spontaneous radiation of the Smith-Purcell radiation effect is generally very weak. To solve this problem, in this embodiment, the external pumping signal, the resonant cavity structure and the grating structure are used at the same time, so that a preliminary bunching of electrons is formed in the resonant cavity structure, and then coherent Smith-Purcell radiation is formed through the interaction between the electrons in the preliminarily bunched state and the grating structure; at the same time, since the positive feedback of energy interaction may be formed by coherent Smith-Purcell radiation and free electrons in the resonant cavity structure, the coherent Smith-Purcell radiation may be further enhanced, and the coherent Smith-Purcell radiation amplified by stimulation may be obtained. It can be seen that since the coherent Smith-Purcell radiation amplified by stimulation in this embodiment is realized by means of a pumping signal and a resonant cavity structure, the requirements for the electron emission source may be lowered, so that high-intensity radiation may be achieved even under the conditions of small current and large beam spots.

In this embodiment, referring to FIG. 5, for example, the generated coherent Smith-Purcell radiation will excite the vertical resonance mode within the primary resonant cavity structure 3, which means that in the primary resonant cavity, in addition to the pumping signals incident from the pumping source 2, there are also coherent Smith-Purcell radiation signals that resonate vertically in the primary resonant cavity structure 3 together. As a result, the pumping signal and the coherent Smith-Purcell radiation signal will further modulate the electron energy together, so that the electron bunching density is further increased, and the coherent Smith-Purcell radiation signal within the primary cavity structure 3 is further enhanced.

In this embodiment, when the coherent Smith-Purcell radiation signal within the primary resonant cavity structure 3 is further enhanced, a positive feedback process is formed through the energy interaction between free electrons and coherent Smith-Purcell radiation to obtain the coherent Smith-Purcell radiation amplified by stimulation, namely the coherent SPR amplified by stimulation is obtained. At the same time, in the stimulated amplification process, the DC electron beam will form periodic bunched electron bunches, and there are abundant frequency multiplication components around the periodic bunched electron bunches.

It can be seen from the above-mentioned technical solutions that, for the terahertz radiator based on coherent Smith-Purcell radiation amplified by stimulation provided by the embodiments of the present application, the pumping signal generated by the pumping source 2 interacts with the primary grating structure 4 within the primary resonant cavity structure 3 to generate a periodic electromagnetic field, and the electron beams emitted by the electron emission source 1 are modulated by the periodic electromagnetic field to achieve preliminary bunching and obtain preliminarily bunched electrons. The preliminarily bunched electrons interact with the primary grating structure 4 to generate coherent Smith-Purcell radiation, which may enhance the intensity and coherence of radiation. The coherent Smith-Purcell radiation and the pumping signals vertically resonate in the primary resonant cavity structure 3, and together modulate the electron energy in the primary resonant cavity structure 3, so that the electron bunching density is increased, and the coherent Smith-Purcell radiation is enhanced, which may further enhance the intensity and coherence of the radiation. In the primary resonant cavity structure 3, the energy interaction between free electrons and coherent Smith-Purcell radiation forms a positive feedback process to obtain coherent Smith-Purcell radiation amplified by stimulation and periodic bunched electron bunches, thus the terahertz radiator based on coherent Smith-Purcell radiation amplified by stimulation provided by the embodiment of the present application first allows free electrons to be preliminarily bunched through the external pumping source signal, and the interaction of the preliminarily bunched electrons and the grating generates coherent Smith-Purcell radiation, and at the same time, the coherent Smith-Purcell radiation signal is stimulated and amplified by the resonant cavity structure to obtain high-density periodic bunched electron bunches. It should be noted that the difference between the technical solutions in this embodiment and the stimulated radiation by backward wave oscillator lies in that the coherent Smith-Purcell radiation amplified by stimulation is achieved by means of the pumping signal and the resonant cavity structure, so that the requirements for the electron emission source may be lowered, as a result, high-intensity radiation may be achieved even under the conditions of small current and large beam spots.

Figure 2:
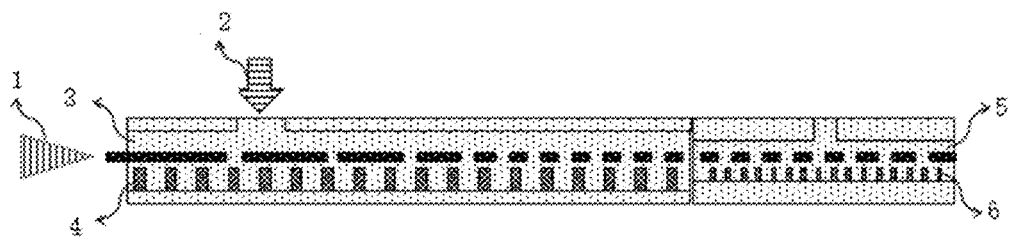
FIG. 2 is a schematic structural diagram of a terahertz radiator based on coherent Smith-Purcell radiation amplified by stimulation according to another embodiment of the present application.

On the basis of the foregoing embodiment, in this embodiment, referring to FIG. 2, the terahertz radiator further includes: a secondary resonant cavity structure 5 and a secondary grating structure 6; an electron beam input end of the secondary resonant cavity structure 5 is connected to an electron beam output end of the primary resonant cavity structure 3; the secondary grating structure 6 is located inside the secondary resonant cavity structure 5, and the period of the secondary grating structure 6 is smaller than the period of the primary grating structure 4;

after entering the secondary resonant cavity structure 5, the periodic bunched electron bunches output by the primary resonant cavity structure 3 interact with the secondary grating structure 6 on the surface of the secondary grating structure 6 to generate a high-order frequency multiplication coherent Smith-Purcell radiation with a preset frequency multiplication order; for example, the preset frequency multiplication order can be 2, 3, 4, etc.

Wherein, the frequency multiplication order is a frequency multiplication order of the high-order frequency multiplication coherent Smith-Purcell radiation relative to the pumping source 2.

In this embodiment, the third part of the present application, that is, using periodic bunched electron bunches generated during the stimulated amplification process to achieve high-order frequency multiplication THz radiation, is mainly introduced.

The technical solution in this embodiment may be understood as how to achieve high-order frequency multiplication THz radiation based on coherent SPR. In this embodiment, the interaction between the periodic bunched electron bunches generated in the second part and another group of small periodic gratings (that is, the secondary grating structure) is used to generate a high-order frequency multiplication coherent SPR signal. Due to the abundant frequency multiplication information in the evanescent field around the bunched electrons, the pumping signal of 0.1 THz and the electron energy of 22 keV are still used as an example, and the power of the pumping signal is 100 mW. When optimal bunching occurs in the electrons, the spectrum of the evanescent field around the electrons is detected and shown in FIG. 7. Through the coherent SPR amplified by stimulation, there is still a significant frequency multiplication signal in the evanescent field around the electrons when the frequency multiplication is 7, which is conducive to the extraction of subsequent high-order frequency multiplication signals to generate high-order frequency multiplication coherent SPR.

In order to extract the evanescent field around the periodic bunched electrons, another set of resonant cavity and grating structure that is, the secondary resonant cavity structure and the secondary grating structure in the device structure needs to be provided. In order to obtain a high-intensity coherent SPR signal output with high-order frequency multiplication, it is preferable to place the secondary resonant cavity structure and the secondary grating structure at the position where the electrons are optimally bunched.

This is because electronic bunching includes three states: preliminary bunching, optimal bunching and over-bunching. The over-bunching will occur after the optimal bunching position. The specific principle is: taking the electron energy of the electron emission source as 22 keV as an example, the pumping signal is still 0.1 THz, and in order to illustrate the working process of the device, the pumping signal power is set to 100 mW. FIG. 6 shows the change in electron beam density during the flight of electrons. By analyzing, it can be seen from FIG. 6 that the DC electrons will be preliminarily bunched under the action of the external pumping signal. As the electrons fly, the pumping signal and the coherent SPR signal modulate the electron energy together, so that the bunching density gradually increases. However, as the flight distance increases, the bunching density decreases again. It should be noted here that the reason why the electrons are bunched is that the pumping signal and the coherent SPR signal form a periodic electromagnetic field on the surface of the grating, the periodic electromagnetic field makes some electrons accelerate, some electrons decelerate, and backward accelerating electrons and forward decelerating electrons form bunching in space. However, when the backward accelerating electrons catch up with the forward decelerating electrons, the electrons are over-bunched, which is the reason why the electron bunching density increases and then decreases in FIG. 6.

In this embodiment, coherent Smith-Purcell radiation is generated using the interaction of the secondary grating and the periodic bunched electrons. It is worth noting that the period $L_2$ of the secondary grating is smaller than the period $L_1$ of the primary grating, and the Smith-Purcell radiation formula at the secondary grating is:

$$\lambda = \frac{L_2}{m}\left(\frac{c}{v} - \cos\theta\right);$$

$\lambda$ represents the radiation wavelength, $L_2$ represents the period of the secondary grating structure, m represents the order of Smith-Purcell radiation, c represents the speed of light in vacuum, v represents the electron velocity, and $\theta$ represents the radiation angle. The radiation intensity of SPR is maximum when m=1, and the following discussion is based on the case of when m=1. By providing the secondary grating and secondary resonant cavity, the high-order frequency multiplication coherent SPR signal generated is also in the vertical resonance mode in the cavity, and the corresponding radiation angle $\theta$ is 90°. Wherein the frequency corresponding to the wavelength $\lambda$ of the high-order frequency multiplication coherent SPR is determined by the frequency of the bunched electron, that is, an integer multiple of the frequency $f_p$ of the pumping signal, satisfying the relationship as follows:

$$\lambda = \frac{c}{nf_p};$$

in the above formula, n is a positive integer greater than or equal to 1, that is, the frequency multiplication order of the coherent frequency multiplication radiation relative to the pumping source. Combining the above two formulas together, it can be seen that the coherent SPR of the higher order frequency n may be extracted by decreasing the period $L_2$ of the secondary grating.

Figure 8:
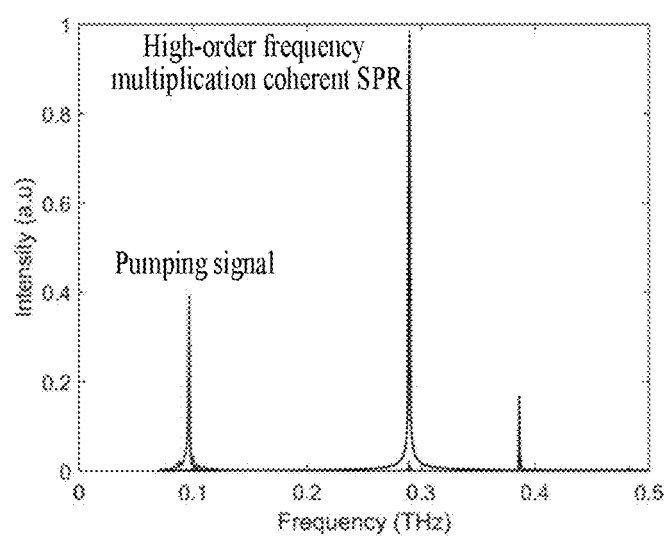
FIG. 8 is a schematic diagram showing a pumping signal input from a terahertz radiator based on coherent Smith-Purcell radiation amplified by stimulation and a high-order frequency multiplication coherent Smith-Purcell signal output by a device according to an embodiment of the present application.

Taking a third-order frequency multiplication coherent SPR at n=3 as an example, the frequency of pumping source signal is 0.1 THz, the incident power is 100 mW, and the frequency of the output high-order frequency multiplication coherent SPR signal is 0.3 THz. The frequency spectrum of the pumping source and the high-order frequency multiplication coherent SPR signal is shown in FIG. 8. Since the stimulated coherent SPR of free electrons in the primary resonant cavity structure causes stimulated bunching of electrons, the SPR signal strength of the high-order frequency multiplication may even be greater than the strength of the pumping source signal, and meanwhile the high-order frequency multiplication signal generated by the periodic bunched electrons has strong coherence.

Referring to FIG. 8, it shows the pumping signal input by a device and the high-order frequency multiplication coherent SPR signal output by a device. It is worth noting that the working process of the device described above is based on an example of a 0.1 THz pumping source, a 22 keV electron emission source, and a triple frequency 0.3 THz coherent SPR. If the incident frequency of the pumping source is changed to the frequency of a microwave signal or other THz band signal, the frequency of the pumping source is in a vertical resonance mode by adjusting the sizes of the primary grating structure and the primary resonant cavity structure. Then, the electron energy of the electron emission source is adjusted so that the electron velocity v, the primary grating period $L_1$ and the pumping source frequency $f_p$ satisfy the relationship $f_p=v/L_1$, through which the coherent SPR amplified by stimulation signal of microwave or other THz frequency is realized in the primary resonant cavity. At the same time, the secondary grating is used to generate other high-order frequency multiplication signals, the microwave signal may be doubled to the THz band, or the THz signal may be doubled to a higher frequency THz signal.

On the basis of the foregoing embodiments, in an embodiment, the electron bunching includes three states: preliminary bunching, optimal bunching and over-bunching; correspondingly, the secondary resonant cavity structure 5 and the secondary grating structure 6 are disposed at positions where the electrons are in the optimal bunching state.

Figure 7:
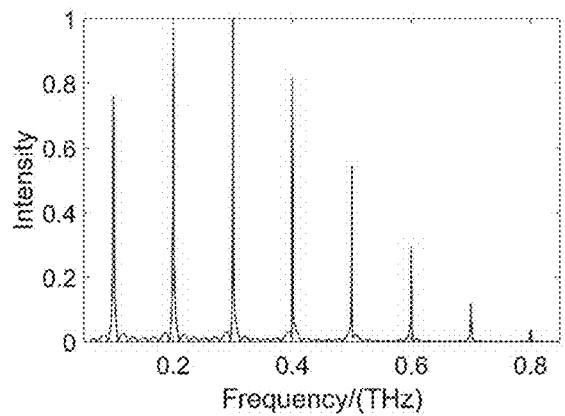
FIG. 7 is a schematic diagram showing a spectrum of the evanescent field around periodic bunched electrons according to an embodiment of the present application.

There is abundant frequency multiplication information in the evanescent field around the bunched electrons. Still taking the pumping signal of 0.1 THz and the electron energy of 22 keV as an example, in which the power of the pumping signal is 100 mW. When the electrons are optimally bunched, the spectrum of the evanescent field around the electrons is detected and shown in FIG. 7. FIG. 7 is a schematic diagram showing a spectrum of the evanescent field around periodic bunched electrons according to an embodiment of the present application. Through the coherent SPR amplified by stimulation, there is still a significant frequency multiplication signal in the evanescent field around the electrons when the frequency multiplication is 7, which is conducive to the extraction of subsequent high-order frequency multiplication signals to generate high-order frequency multiplication coherent SPR.

It can be seen from the above technical solution that, in the terahertz radiator based on coherent Smith-Purcell radiation amplified by stimulation provided by the embodiment of the present application, the secondary resonant cavity structure 5 and the secondary grating structure 6 are disposed at a position where the electrons are in the optimal bunching state, which is beneficial to generating high-order frequency multiplication coherent Smith-Purcell radiation signal 7.

On the basis of the foregoing embodiments, in an embodiment, the period of the secondary grating structure 6 and the frequency multiplication order satisfy a first relationship model which is expressed as:

$$\frac{L_2}{m}\left(\frac{c}{v} - \cos\theta\right) = \frac{c}{nf_p};$$

wherein, $L_2$ represents the period of the secondary grating structure, m represents the order of the Smith-Purcell radiation, c represents the speed of light in vacuum, v represents the velocity of electrons, $\theta$ represents the radiation angle, n represents the frequency multiplication order, n is a positive integer greater than or equal to 1, and $f_p$ represents the pumping frequency of the pumping source.

In this embodiment, through the above-mentioned first relationship model, it is realized that every time the electrons pass through a period of the secondary grating structure, the pumping signal oscillates at exactly one frequency.

It can be seen from the first relationship model that the high-order frequency multiplication coherent Smith-Purcell radiation signal 7 is determined by the frequency of the bunched electrons. In the above formula, n is a positive integer greater than or equal to 1, that is, the coherent frequency multiplication radiation is relative to the frequency multiplication order of the pumping source; it is beneficial to extract the coherent Smith-Purcell radiation signal of higher order frequency n by decreasing the period $L_2$ of the secondary grating.

On the basis of the foregoing embodiments, in an embodiment, the pumping source 2 outputs a first terahertz signal, the secondary resonant cavity structure 5 outputs a second terahertz signal, and the frequency of the second terahertz signal is higher than that of the first terahertz signal.

It can be seen from the above technical solution that, in the terahertz radiator based on coherent Smith-Purcell radiation amplified by stimulation provided by the embodiment of the present application, the frequency of the second terahertz signal output by the secondary resonant cavity structure 5 is higher than that of the first terahertz signal, and the second terahertz signal has extremely strong radiation intensity and coherence.

On the basis of the foregoing embodiments, in an embodiment, the pumping source 2 outputs a first terahertz signal or a microwave signal, and the secondary resonant cavity structure 5 outputs a terahertz signal.

It can be seen from the above technical solution that the conversion from microwave signals to terahertz signals and from terahertz signals to high-frequency terahertz signals may be realized through the terahertz radiator based on coherent Smith-Purcell radiation amplified by stimulation provided by the embodiment of the present application. Compared to Smith-Purcell radiation between DC electrons and gratings, the coherent Smith-Purcell may enhance the intensity and coherence of radiation.

On the basis of the foregoing embodiments, in an embodiment, the pumping source 2 outputs a first terahertz signal, the electron velocity v, the period $L_1$ of the primary grating structure 4, and the pumping frequency $f_p$ of the pumping source satisfy a second relationship model which is expressed as: $f_p=v/L_1$.

On the basis of the foregoing embodiments, in an embodiment, the electron beam has an energy of 10 to 30 keV, a current of 10 to 50 mA, and a beam spot diameter of 100 to 120 μm.

In the terahertz radiator based on coherent Smith-Purcell radiation amplified by stimulation provided by the embodiment of the present application, when the electron beam has an energy of 10 to 30 keV, a current of 10 to 50 mA, and a beam spot diameter of 100 to 120 μm, the generated high-order frequency multiplication coherent Smith-Purcell radiation signal 7 has extremely strong radiation intensity and coherence.

On the basis of the foregoing embodiments, in an embodiment, the terahertz radiator further includes a magnetic ring structure 8;

the magnetic ring structure 8 is wrapped outside the resonant cavity structure for focusing the electron beam.

It can be seen from the above technical solution that in the terahertz radiator based on coherent Smith-Purcell radiation amplified by stimulation provided by the embodiment of the present application, the electron beam is focused through the magnetic ring structure 8, which is conducive to the preliminary bunching of the electron beam, and the subsequent interaction with the secondary grating structure 6 in the secondary resonant cavity structure 5 to generate high-order frequency multiplication coherent Smith-Purcell radiation with a preset frequency multiplication order, thereby reducing electron dispersion and electron loss.

On the basis of the foregoing embodiments, in an embodiment, the terahertz radiator further includes an electron collector 9;

the electron collector 9 is configured to collect the electron beam which is emitted by the electron emission source 1 and passes through the grating structures and the resonant cavity structures.

It can be seen from the above technical solutions that in the terahertz radiator based on coherent Smith-Purcell radiation amplified by stimulation provided by the embodiment of the present application, the electron beam emitted from the electron emission source 1 and passed through the grating structure and the resonant cavity structure is collected by the electron collector 9.

In order to understood the embodiments of the present application well, the content of the embodiments of the present application is further described below in conjunction with FIGS. 3-8, but the present application is not limited to the embodiments of the present application.

Terahertz (THz, 1 THz=1012 Hz) waves refer to electromagnetic waves with frequencies in 0.1 THz to 10 THz frequency band. Terahertz waves have strong penetrability and may be used in the field of security detection. In addition, the terahertz wave photon has low energy and good coherence, and has great application value in the fields of non-destructive quality inspection, biological in vivo imaging, and space optical communication. Therefore, terahertz technology is also considered to be one of the most important technologies in the future.

Smith-Purcell radiation (SPR) refers to the electromagnetic radiation generated by the interaction between flying free electrons and the grating. The expression of the radiation wavelength is $$\lambda = \frac{L}{m}\left(\frac{c}{v} - \cos\theta\right);$$

the radiation wavelength λ is related to the grating period L, the electron velocity v, and the electromagnetic radiation angle θ, m is the order of SPR, and the output of electromagnetic wave of a specific wavelength may be realized through the design of the electron gun and grating period. Stimulated SPR refers to the positive feedback process in which the SPR generated by free electrons interact with the electron beam to achieve energy interaction. A miniaturized high-intensity THz radiation source may be provided if the stimulated SPR in the terahertz frequency band is realized. At the same time, in the process of stimulated SPR, the DC electron beam will form periodically bunched electron bunches, the periodically bunched electrons are surrounded by abundant frequency multiplication components, and the high-order frequency multiplication THz radiation may be further extracted through the secondary grating structure.

Figure 3:
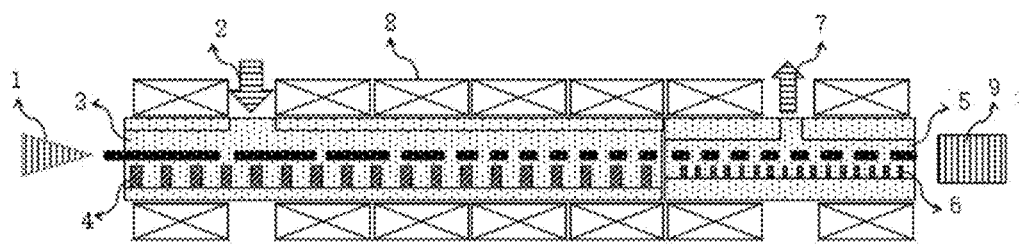
FIG. 3 is a schematic structural diagram of a terahertz radiator based on coherent Smith-Purcell radiation amplified by stimulation according to yet another embodiment of the present application.

FIG. 3 is a schematic structural diagram of a terahertz radiator based on coherent Smith-Purcell radiation amplified by stimulation according to yet another embodiment of the present application, showing that the current threshold condition that needs to be met for the stimulated amplification of electrons may be effectively avoided, and high-density electron bunching and high-intensity double-frequency THz signals may be realized through coherent SPR amplified by stimulation. The device mainly includes the following parts, and the structural parameters and functions of each part are introduced as follows:

an electron emission source 1, configured to emit an electron beam. For example, the energy of the electron beam is 10 to 30 keV, the current of the electron beam is 10 to 50 mA, and the beam spot diameter is 100 to 120 μm;

a pumping source 2, configured to generate pumping signals which are incident into the primary resonant cavity structure 3, and a periodic electromagnetic field is stimulated on the surface of the primary grating structure 4. The pumping source 2 may have a frequency of a microwave signal or a THz signal, and the frequency $f_p$ of the pumping source 2 is in the vertical resonance mode of the primary resonant cavity structure 3 for preliminary bunching of DC electrons;

a primary resonant cavity structure 3; the resonant mode in the primary resonant cavity may be adjusted by setting the height and width of the primary resonant cavity structure 3, so that the pumping source 2 and the coherent SPR signal resonate vertically in the primary resonant cavity;

a primary grating structure 4; the resonant mode in the primary resonant cavity may be adjusted by setting the period, height, width and other parameters of the primary grating structure 4; the period $L_1$ of the primary grating structure 4, the electron velocity v, and the frequency $f_p$ of the pumping source 2 satisfy the relationship $f_p=v/L_1$; the preliminarily bunched electrons interact with the primary grating structure 4 to generate coherent SPR, a periodic electromagnetic field formed by the pumping source 2 and the coherent SPR signal on the surface of the primary grating may be used to modulate the electron energy to achieve electron bunching;

a secondary resonant cavity structure 5; the resonant mode in the secondary resonant cavity may be adjusted by setting parameters such as the height and width of the secondary resonant cavity structure 5, so that the high-order frequency multiplication coherent SPR signal vertically resonates in the secondary resonant cavity;

a secondary grating structure 6; the resonant mode in the secondary resonant cavity may be adjusted by setting the period, height, width and other parameters of the secondary grating structure 6; the period $L_2$ of the secondary grating structure 6 is smaller than the period $L_1$ of the primary grating structure 4, and a high-order frequency multiplication coherent Smith-Purcell radiation signal 7 may be generated through the interaction between the periodic bunched electrons and the secondary grating structure 6;

a high-order frequency multiplication coherent Smith-Purcell radiation signal 7; the output high-order frequency multiplication coherent Smith-Purcell radiation signal 7 is the high-order frequency multiplication signal of the pumping source 2, and the smaller the grating period of the secondary grating structure 6, the higher the frequency multiplication order of the generated high-order frequency multiplication coherent SPR signal;

a magnetic ring structure 8, configured to focus the electron beam; for example, the magnetic ring structure 8 is wrapped outside the device structure to reduce the diffusion that occurs during the flight of the electrons; the intensity of the magnetic field is about 0.3 T; and an electron collector 9, configured to collect the electron beams which are emitted by the electron emission source 1 and pass through the primary resonant cavity structure, the secondary resonant cavity structure, the primary grating structure, and the secondary grating structure.

Figure 4:
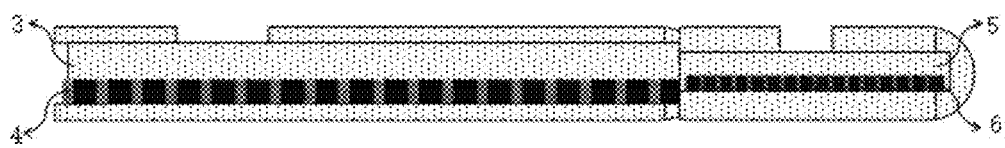
FIG. 4 is a three-dimensional schematic diagram of a primary resonant cavity structure, a primary grating structure, a secondary resonant cavity structure, and a secondary grating structure according to an embodiment of the present application.

FIG. 4 is a three-dimensional schematic diagram of a primary resonant cavity structure, a primary grating structure, a secondary resonant cavity structure, and a secondary grating structure. The primary resonant cavity, the primary grating, the secondary resonant cavity and the secondary grating are prepared by machining inside a metal cylinder with an outer diameter of 3 mm. The metal cylinder is commonly made of materials such as copper, gold, silver, etc. When the device works in the frequency band of 0.1~10 THz, the period of the first grating and the second grating is in the range of 5 μm to 1 mm, and the specific period needs to satisfy the relationship $f_p=v/L_1$ with the electron velocity v and the frequency $f_p$ of the pumping source.

Regarding the device structure of the terahertz radiator based on coherent Smith-Purcell radiation amplified by stimulation in the embodiments of the present application, the working principle and specific working process of the device will be described below. One of the research objectives of the embodiments of the present application is to reduce the requirements for electron beam current when electrons are stimulated, so as to realize the stimulation and coherent radiation of free electrons even under the conditions of small current and large beam spots.

The working principle and specific working process of the device structure of the terahertz radiator based on coherent Smith-Purcell radiation amplified by stimulation according to the embodiments of the present application are mainly divided into three parts: the first part is to preliminarily bunch the DC electron beam by the external pumping signal; the second part is to realize the coherent SPR amplified by stimulation in the vertical resonant cavity through the preliminary bunching of electrons; the third part is using periodically bunched electron bunches generated during the stimulated amplification process to achieve high-order frequency multiplication THz radiation.

For example, the parameters of the electron emission source 1 used in the embodiments of the present application are: the electron energy is 10 to 30 keV, the diameter of electron beam spot is about 100 to 120 μm, and the current intensity is 10 to 50 mA. By changing the frequency of pumping source and the period of gratings, the working frequency of the device radiation may be 0.1 THz or even greater than 1 THz. The three parts regarding working of the device will be elaborated below.

A. Preliminarily Bunching DC Electrons by External Pumping Signals

The first part regarding working of the device is to preliminarily bunch DC electrons by external pumping signals. The involved structures include a primary resonant cavity structure and a primary grating structure. The external pumping source works with a frequency at which the group velocity of the primary resonant cavity and the primary grating structure is zero. Taking a 0.1 THz pumping source as an example, the structural diagram of the dispersion curves formed by the primary resonant cavity structure and the primary grating structure is shown in FIG. 5. By designing the primary grating and the primary resonant cavity structure, the external pumping signal excites the vertical resonance mode in the structure, the corresponding group velocity is zero, and the phase velocity tends to infinity. The external pumping signal plays a role by being incident into the primary resonant cavity and interacting with the primary grating to generate a periodic local field, allowing the DC electrons to be preliminarily bunched. At this time, the electron velocity v, the grating period $L_1$ and the pump frequency $f_p$ satisfy the relationship $f_p=v/L_1$, that is, every time the electron passes through a grating period, the pumping signal oscillates at exactly one frequency. The power of the external pumping signal can be applied in the order of 1 mW~1 W, the energy of the electron beam is 10~30 keV, the beam spot diameter is 100~120 μm, and the electron beam current can be 10 mA~50 mA. Electrons will be preliminarily bunched under the external pumping action.

Referring to FIG. 5, the dispersion curve of the primary resonant cavity and the primary grating structure is shown. The pumping source works at the point where the group velocity is zero. At this time, the pumping signal works in the vertical resonance mode, and the phase velocity tends to infinity; the group velocity at the intersection of electron dispersion and structural dispersion is zero, that is, the preliminarily bunched electrons may excite the coherent radiation mode of vertical resonance.

B. Coherent SPR Amplified by Stimulation in the Resonant Cavity

The second part regarding working of the device is to realize the coherent SPR amplified by stimulation in the vertical resonant cavity through the preliminary bunching of electrons. The coherent SPR of free electrons refers to the electromagnetic radiation produced by the interaction of bunched electrons and gratings. It is proposed in the embodiments of the present application a stimulated coherent SPR device based on a resonant cavity, so that the preliminarily bunched electrons interact with the coherent SPR mode of the resonant cavity to generate a coherent SPR amplified by stimulation signal. The preliminarily bunched electrons interact with the primary grating in the primary resonant cavity, and their dispersion intersection point is also at the point where the group velocity is zero, as shown in FIG. 5, that is, the coherent SPR generated by the preliminarily bunched electrons also excites the vertical resonance mode in the cavity. This means that in the primary resonant cavity, in addition to the signals incident from the pumping source, there are also coherent SPR signals that resonate vertically in the cavity. Then, the pumping signal and the coherent SPR signal of the preliminarily bunched electrons will further modulate the electron energy together, so that the electron bunching density is further increased, and the coherent SPR signal in the resonant cavity is further enhanced, thereby a positive feedback process of energy interaction between free electrons and coherent SPR signals is formed, that is, the coherent SPR amplified by stimulation is formed.

FIG. 6 provides a schematic diagram of the change in electron beam density. Referring to FIG. 6, the change in electron beam density during the flight of electrons, the electrons forming from preliminary bunching to optimal bunching and finally to over-bunching, as well as the bunching density first increasing and then decreasing are as shown.

Taking the electron energy of the electron emission source as 22 keV as an example, the frequency of the pumping signal is still 0.1 THz. To illustrate the working process of the device, the power of the pumping signal is set to 100 mW. FIG. 6 shows the change in the electron beam density during the flight of the electrons. By analyzing, it can be seen from FIG. 6 that the DC electrons will be preliminarily bunched under the action of the pumping signal. As the electrons fly, the pumping signal and the coherent SPR signal modulate the electron energy together, so that the bunching density gradually increases. However, as the flight distance further increases, the bunching density decreases again. It should be noted here that the reason why the electrons are bunched is that the pumping signal and the coherent SPR signal form a periodic electromagnetic field on the surface of the grating, the periodic electromagnetic field makes some electrons accelerate, some electrons decelerate, and backward accelerating electrons and forward decelerating electrons form clusters in space. However, when the backward accelerating electrons catch up with the forward decelerating electrons, the over-bunching occurs in the electrons, which is the reason why the electron bunching density increases and then decreases in FIG. 6.

C. High-Order Frequency Multiplication THz Radiation Based on Coherent SPR

The third part regarding working of the device is to generate a high-order frequency multiplication coherent SPR signal through the interaction between the periodic bunched electron bunches generated in the second part and another group of small periodic gratings (that is, the secondary grating structure). There is abundant frequency multiplication information in the evanescent field around the bunched electrons. Still taking the pumping signal of 0.1 THz and the electron energy of 22 keV as an example, in which the power of the pumping signal is 100 mW. When the electrons are optimally bunched, the spectrum of the evanescent field around the electrons detected is shown in FIG. 7. FIG. 7 is a schematic diagram showing a spectrum of the evanescent field around periodic bunched electrons according to an embodiment of the present application. Through the coherent SPR amplified by stimulation, there is still a significant frequency multiplication signal in the evanescent field around the electrons when the frequency multiplication is 7, which is conducive to the extraction of subsequent high-order frequency multiplication signals to generate high-order frequency multiplication coherent SPR.

In order to extract the evanescent field around the periodic bunched electrons, another set of resonant cavity and grating structure, that is, the secondary resonant cavity structure and the secondary grating structure in the device structure needs to be provided, and in order to obtain a coherent SPR signal output with high-intensity and high-order frequency multiplication, it is preferable to dispose the secondary resonant cavity structure and the secondary grating structure at the position where the electrons are optimally bunched.

Coherent Smith-Purcell radiation is generated using the interaction of the secondary grating and the periodic bunched electrons. It is worth noting that the period $L_2$ of the secondary grating is smaller than the period $L_1$ of the primary grating, and the Smith-Purcell radiation formula at the secondary grating is:

$$\lambda = \frac{L_2}{m}\left(\frac{c}{v} - \cos\theta\right);$$

wherein $L_2$ represents the period of the secondary grating structure, v is the electron velocity, c is the speed of light in vacuum, and m is the order of Smith-Purcell radiation. The radiation intensity of SPR is maximum when m=1, and the following discussion is based on the case of when m=1. By providing the secondary grating and secondary resonant cavity, the high-order frequency multiplication coherent SPR signal generated is also in the vertical resonance mode in the cavity, and the corresponding radiation angle θ is 90°. Wherein the frequency corresponding to the wavelength λ of the high-order frequency multiplication coherent SPR is determined by the frequency of the bunched electron, that is, an integer multiple of the frequency $f_p$ of the pumping signal, satisfying the relationship as follows:

$$\lambda = \frac{c}{nf_p};$$

in the above formula, n is a positive integer greater than or equal to 1, that is, the frequency multiplication order of the coherent frequency multiplication radiation relative to the pumping source. By combining the above two formulas together, it can be seen that the coherent SPR of the higher order frequency n may be extracted by decreasing the period $L_2$ of the secondary grating.

Taking a third-order frequency multiplication coherent SPR at n=3 as an example, the frequency of pumping source signal is 0.1 THz, the incident power is 100 mW, and the frequency of the output high-order frequency multiplication coherent SPR signal is 0.3 THz. The frequency spectrum of the pumping source and the high-order frequency multiplication coherent SPR signal is shown in FIG. 8. FIG. 8 is a schematic diagram showing a pumping signal input from a terahertz radiator based on coherent Smith-Purcell radiation amplified by stimulation and a high-order frequency multiplication coherent Smith-Purcell signal output by a device according to an embodiment of the present application. Since the stimulated coherent SPR of free electrons in the primary resonant cavity structure causes stimulated bunching of electrons, the SPR signal strength of the high-order frequency multiplication can even be greater than the strength of the pumping source signal, and meanwhile the high-order frequency multiplication signal generated by the periodic bunched electrons has strong coherence.

It is worth noting that the working process of the device described above is based on an example of a 0.1 THz pumping source, a 22 keV electron emission source, and a triple frequency 0.3 THz coherent SPR. If the incident frequency of the pumping source is changed to the frequency of a microwave signal or other THz band signal, the frequency of the pumping source is in a vertical resonance mode by adjusting the sizes of the primary grating structure and the primary resonant cavity structure. Then, the electron energy of the electron emission source is adjusted so that the electron velocity v, the primary grating period $L_1$ and the pumping source frequency $f_p$ satisfy the relationship $f_p=v/L_1$, through which the coherent SPR amplified by stimulation signal of microwave or other THz frequency is realized in the primary resonant cavity. At the same time, the secondary grating is used to generate other high-order frequency multiplication signals, the microwave signal may be doubled to the THz band, or the THz signal may be doubled to a higher frequency THz signal.

In summary, the embodiments of the present application have at least the following advantages:

1. In the embodiments of the present application, a periodic electromagnetic field is generated by the interaction of a pumping source signal and a periodic grating, the electron beam is modulated by the periodic electromagnetic field to achieve preliminary bunching, and then the preliminarily bunched electrons are stimulated and amplified by coherent radiation, so that the stimulated amplification phenomenon may be realized even under the conditions of small current and large beam spots, which can effectively reduce the requirement for the electron emission source for realizing the stimulated amplification in the traditional device.
2. In the embodiment of the present application, a resonant cavity structure is introduced; by means of coherent Smith-Purcell radiation amplified by stimulation, only a weak pumping source signal is needed to achieve positive feedback between free electrons and coherent radiation to obtain high-density free electron periodic bunching, which greatly increases the high-order frequency multiplication information and coherence of the evanescent field around the electrons.
3. In the embodiment of the present application, the interaction of the bunched electrons and the periodic grating is used to generate high-order frequency multiplication coherent Smith-Purcell radiation, through which the conversion of microwave signal to THz signal and THz signal to high frequency multiplication THz signal may be realized. Compared with Smith-Purcell radiation between DC electrons and grating, coherent Smith-Purcell may enhance the intensity and coherence of radiation.

In addition, in the present application, terms such as "first" and "second" are only used for descriptive purposes, and cannot be understood as indicating or implying relative importance or implicitly specifying the number of technical features indicated. Therefore, the features defined with "first" and "second" may explicitly or implicitly include at least one of the features. In the description of the present application, "a plurality of" means at least two, such as two, three, etc., unless otherwise specifically defined.

In addition, in the present application, relationship terms such as first and second are only used to distinguish one entity or operation from another entity or operation, and do not necessarily require or imply any such actual relationship or order between these entities or operations. Moreover, the terms "include," "comprise" or any other variants thereof are intended to cover non-exclusive inclusion, so that a process, method, article or device including a series of elements includes not only those elements, but also other elements that are not explicitly listed, or include elements inherent to the process, method, article, or device. Without further restrictions, the element defined by the sentence "including a . . . " does not exclude the existence of other identical elements in the process, method, article, or device that includes the element.

In addition, in the description of this specification, the reference terms "one embodiment," "some embodiments," "examples," "specific examples," "some examples" or the like mean that the specific features, structures, materials or characteristics described in conjunction with the embodiments or examples are included in at least one embodiment or example of the present application. In this specification, the schematic representations of the above-mentioned terms do not necessarily refer to the same embodiment or example. Moreover, the described specific features, structures, materials or characteristics can be combined in any one or more embodiments or examples in a suitable manner. In addition, those skilled in the art can combine the different embodiments or examples and the features of the different embodiments or examples described in this specification without mutual contradiction.

Finally, it should be noted that the embodiments above are only for illustrating the technical solutions of the present application, rather than limiting them; although the present application has been described in detail with reference to the foregoing embodiments, those skilled in the art should understand that the technical solutions documented in the preceding embodiments may still be modified, or parts of the technical features therein may be equivalently substituted; and such modifications or substitutions do not make the essence of the corresponding technical solutions separate from the spirit and scope of the technical solutions of the embodiments of the present application.

What is claimed is:

1. A terahertz radiator based on coherent Smith-Purcell radiation amplified by stimulation, comprising: an electron emission source, a pumping source, a primary resonant cavity structure, and a primary grating structure; wherein the primary grating structure is located inside the primary resonant cavity structure;

the electron emission source is located at an axial inlet position of the primary resonant cavity structure, and is configured to emit electron beams which are incident into the primary resonant cavity structure along an axial direction of the primary resonant cavity structure and then fly along a surface of the primary grating structure;

the pumping source is located at an inlet position on a side wall of the primary resonant cavity structure, and is configured to emit pumping signals which are incident into the primary resonant cavity structure and then interacts with the primary grating structure on the surface of the primary grating structure to generate a periodic electromagnetic field; the periodic electromagnetic field causes electrons flying along the surface of the primary grating structure to preliminarily bunch to obtain preliminarily bunched electrons; wherein the frequency of the pumping source is in a vertical resonance mode of the primary resonant cavity structure;

the preliminarily bunched electrons interact with the primary grating structure to generate coherent Smith-Purcell radiation;

the coherent Smith-Purcell radiation and the pumping signals vertically resonate in the primary resonant cavity structure, and together modulate the electron energy in the primary resonant cavity structure, causing an increase in the electron bunching density, thereby enhancing the coherent Smith-Purcell radiation;

in the primary resonant cavity structure, a positive feedback process is formed by an energy interaction between free electrons and the coherent Smith-Purcell radiation to obtain coherent Smith-Purcell radiation amplified by stimulation and periodic bunched electron bunches.

2. The terahertz radiator based on coherent Smith-Purcell radiation amplified by stimulation of claim 1, further comprising:

a secondary resonant cavity structure and a secondary grating structure;

wherein an electron beam input end of the secondary resonant cavity structure is connected to an electron beam output end of the primary resonant cavity structure;

the secondary grating structure is located inside the secondary resonant cavity structure, and a period of the secondary grating structure is smaller than a period of the primary grating structure;

after entering the secondary resonant cavity structure, the periodic bunched electron bunches output from the primary resonant cavity structure interact with the secondary grating structure on the surface of the secondary grating structure to generate a high-order frequency multiplication coherent Smith-Purcell radiation with a preset frequency multiplication order;

wherein, the frequency multiplication order is a frequency multiplication order of the high-order frequency multiplication coherent Smith-Purcell radiation relative to the pumping source.

3. The terahertz radiator based on coherent Smith-Purcell radiation amplified by stimulation of claim 2, wherein an electron bunching comprises three states: preliminary bunching, optimal bunching and over-bunching; correspondingly, the secondary resonant cavity structure and the secondary grating structure are disposed at positions where the electrons are in the optimal bunching state.

4. The terahertz radiator based on coherent Smith-Purcell radiation amplified by stimulation of claim 2, wherein the period of the secondary grating structure and the frequency multiplication order satisfy a first relationship model which is expressed as:

$$\frac{L_2}{m}\left(\frac{c}{v} - \cos\theta\right) = \frac{c}{nf_p};$$

wherein, $L_2$ represents the period of the secondary grating structure, m represents the order of the Smith-Purcell radiation, c represents the speed of light in vacuum, v represents the velocity of electrons, θ represents the radiation angle, n represents the frequency multiplication order, n is a positive integer greater than or equal to 1, and $f_p$ represents the pumping frequency of the pumping source.

5. The terahertz radiator based on coherent Smith-Purcell radiation amplified by stimulation of claim 2, wherein the pumping source outputs a first terahertz signal, the secondary resonant cavity structure outputs a second terahertz signal, and the frequency of the second terahertz signal is higher than the frequency of the first terahertz signal.

6. The terahertz radiator based on coherent Smith-Purcell radiation amplified by stimulation of claim 2, wherein the pumping source outputs a microwave signal, and the secondary resonant cavity structure outputs a terahertz signal.

7. The terahertz radiator based on coherent Smith-Purcell radiation amplified by stimulation of claim 1, wherein electron velocity v, period Li of the primary grating structure, and the pumping frequency $f_p$ of the pumping source satisfy a second relationship model which is expressed as: $f_p=v/L_1$.

8. The terahertz radiator based on coherent Smith-Purcell radiation amplified by stimulation of claim 1, wherein the electron beam has an energy of 10 to 30 keV, a current of 10 to 50 mA, and a beam spot diameter of 100 to 120 μm.

9. The terahertz radiator based on coherent Smith-Purcell radiation amplified by stimulation of claim 1, further comprising a magnetic ring structure;

the magnetic ring structure is wrapped outside the resonant cavity structure for focusing the electron beam.

10. The terahertz radiator based on coherent Smith-Purcell radiation amplified by stimulation of claim 2, further comprising an electron collector;

wherein the electron collector is configured to collect the electron beam which is emitted by the electron emission source and passes through the primary and secondary grating structures and the primary and secondary resonant cavity structures.

* * * * *